United States Patent [19]
Taylor et al.

[11] Patent Number: 5,367,177
[45] Date of Patent: * Nov. 22, 1994

[54] WAVELENGTH SELECTIVE HETEROJUNCTION FIELD EFFECT TRANSISTOR

[75] Inventors: Geoffrey W. Taylor; Steve Sargood, both of Holmdel, N.J.

[73] Assignee: The United States of America as represented by the Secretary of the Air Force, Washington, D.C.

[*] Notice: The portion of the term of this patent subsequent to May 29, 2010 has been disclaimed.

[21] Appl. No.: 70,649

[22] Filed: May 28, 1993

Related U.S. Application Data

[63] Continuation-in-part of Ser. No. 731,689, Jul. 17, 1991, abandoned.

[51] Int. Cl.$^5$ .................. H01L 27/14; H01L 31/00
[52] U.S. Cl. ........................... 257/20; 257/21; 257/24; 257/187; 257/192
[58] Field of Search ............ 257/20, 21, 23, 24, 257/14, 9, 184, 185, 187, 189, 191, 192, 194

[56] References Cited

U.S. PATENT DOCUMENTS

| | | | |
|---|---|---|---|
| 4,589,115 | 5/1986 | Burnham et al. | 372/20 |
| 4,706,251 | 11/1987 | Rona | 372/4 |
| 4,743,083 | 5/1988 | Schimpe | 350/96.19 |
| 4,761,791 | 8/1988 | Stegmuller | 372/46 |
| 4,815,087 | 3/1989 | Hayashi | 372/45 |
| 5,010,374 | 4/1991 | Cooke et al. | 357/19 |
| 5,034,794 | 7/1991 | Murotani | 257/21 |
| 5,075,749 | 12/1991 | Chi et al. | 357/16 |
| 5,099,489 | 3/1992 | Levi et al. | 372/38 |
| 5,117,469 | 5/1992 | Cheung et al. | 372/45 |
| 5,224,115 | 6/1993 | Taylor et al. | 372/96 |

OTHER PUBLICATIONS

Goossen, K. W., et al, "Grating Enhancement . . ." Appl. Phys. Lett. 53(12) Sep. 1988 pp. 1027-1029.

Primary Examiner—Sara W. Crane
Attorney, Agent, or Firm—Donald J. Singer; Irwin P. Garfinkle

[57] ABSTRACT

An optical device which uses a heterojunction field effect detector (HFED) having wavelength selectivity through the use of ion-implantation, and a wavelength selective grating. The device incorporates a Grinsch layer structure with a single GaAs quantum well. The optical power from the lens couples into a guided mode. The absorbing region is the quantum well itself. In the operation of the HFED, a positive bias is applied to the gate, and the depleted GaAs quantum well below the gate absorbs the photons, generating electron-hole pairs. The photocarriers are separated by the electric field before recombination can occur. The photocurrent is then produced in the external circuit by appropriately biasing the device. For collecting the electrons, a positive bias is applied to both the source and drain contacts, which act as dual drain contacts. The holes are removed via the collector which is maintained at ground. To maximize the responsivity (i.e., output photocurrent for input optical power) the edge-coupling technique for coupling the light from an optical fiber into the device is used. Wavelength selectivity is attained through the use of an ion implanted grating to decrease the required length of the device thereby increasing the speed of the device.

2 Claims, 1 Drawing Sheet

WAVELENGTH SELECTIVE HETEROJUNCTION FIELD EFFECT TRANSISTOR

STATEMENT OF GOVERNMENT INTEREST

The invention described herein may be manufactured and used by or for the Government for governmental purposes without the payment of any royalty thereon.

This application is a continuation-in-part of application Ser. No. 07/731,689, filed 17 Jul. 1991, abandoned.

SUMMARY OF THE INVENTION

The present invention is an optical switch which uses a heterojunction field effect detector (HFED) having wavelength selectivity through the use of ion-implantation, and a wavelength selective grating. The device incorporates a Grinsch layer structure or a sch (separate confinement heterostructure) with a single GaAs quantum well. The result is that the optical power couples into a guided mode. The absorbing region is the quantum well itself. The principal of operation of the HFED lies in applying a positive bias to the gate, and using the depleted GaAs quantum well below the gate to absorb the photons, generating electron-hole pairs. The photocarriers are separated by the high electric field before recombination can occur. The photocurrent is then produced in the external circuit by appropriately biasing the device. For collecting the electrons, a positive bias is applied to both of the channel contacts, i.e. the source and drain contacts for conventional FET operation, which now act as dual drain contacts with the FET structure operating in the detector mode (HFED). The holes are removed via the collector which is maintained at ground. To maximize the responsivity (i.e., output photocurrent for input optical power) the edge-coupling technique for coupling the light from an optical fiber into the device is used.

Wavelength selectivity is attained through the use of an ion implanted grating. This has the advantage of decreasing the required length of the device required for the complete adsorption of light and thereby increasing the speed of the device. The grating is formed by implanting the source and drain contacts. Thus, rather than forming n+ as cpntinuous regions, they are formed as periodic n+ wells separated by undoped regions periodic along the vertical sidewall of the device absorbing region, defined by the gate length. It uses the principal of electrorefraction to change the refractive index in a periodic manner when a bias voltage is applied to the contacts.

BACKGROUND OF THE INVENTION

Recent progress in the performance of many optoelectric devices has allowed the development of optoelectronic circuit technology to become a viable prospect. The Inversion Channel Technology, which originated with the conception of the BICFET (see Taylor et al, IEEE Trans. Electron Device, Ed-32, No. 11, November 1985) and DOES (see Simmons et al, IEEE Trans. Electron Devices Ed-32, No. 5, pp 2345-2367, May 1987) has been further developed to include the HFET (see Taylor et al, Electron Lett., Vol. 22, No. 12, July 1986) and also see Taylor et al, Appl. Phys. Lett. 47 (12), p 1754-1756, 15 Jun. 1987. This invention is an advancement of the HFED, specifically by providing the HFED with means for obtaining a high speed structure with wavelength selectivity.

Specifically, this invention modifies the HFED by incorporating a grating into the photodetector structure. Incorporation of a grating into a photoconductor structure was demonstrated by Goossen and Lyon in Appl. Phys. Lett. 47 (12), pp 1754-1756, 15 Jun. 1987, and in Appl. Phys. Letter. 53 (12), pp 1027-1029. However, the grating of Goossen et al was for enhancement of the optical absorption, and not wavelength selectivity. Photodetector structures with wavelength selectivity have also been previously demonstrated, see Wood et al, Appl. Phys. Lett. 47 (3), pp 190-192, 1 Aug. 1985, and also see Larson et al, Appl. Phys. Lett. 49 (5), pp 233-235, 4 Aug. 1986, but neither of these devices made use of a grating as is provided in accordance with this invention.

The HFED design has been made compatible with both the HFET and DOES for optoelectronic integration. However, the processing technology allows for the inclusion of a grating without affecting the other devices.

OTHER PRIOR ART

A search of the prior art revealed the following United States patents:

The U.S. Pat. No. 4,589,115 to Burnham teaches a method of tuning the wavelength of a heterostructure laser by using an external diffraction grating.

The U.S. Pat. No. 4,706,251 to Rona teaches the use of a grated MOSFET for tuning a coherent light source.

The U.S. Pat. No. 4,743,083 to Schimpe teaches a cylindrical diffraction grating coupler and distributed feedback resonators for waveguides.

The U.S. Pat. No. 4,761,791 to Stegmuller teaches a waveguide laser diode having a grating formed in the discontinuity structure of the semiconductor material.

The U.S. Pat. No. 4,815,087 to Hayashi teaches a light emitting semiconductor device having an active layer composed of semiconductor layers of the quantum well structure interposed between the first and second semiconductor layers.

OBJECTS OF THE INVENTION

It is an object of the invention to provide a Heterojunction Field Effect Detector with a grating to obtain a high speed structure with wavelength selectivity.

Another object of this invention is to use an ion-implanted grating in the Heterojunction Field Effect Detector to decrease the required length of the structure while attaining a single narrow linewidth detection.

DESCRIPTION OF THE DRAWINGS

For further objects, and for a clearer understanding of the nature of this invention, reference should now be made to the following specification and to the accompanying drawing in which.

DESCRIPTION OF A PREFERRED EMBODIMENT

Figure 1:
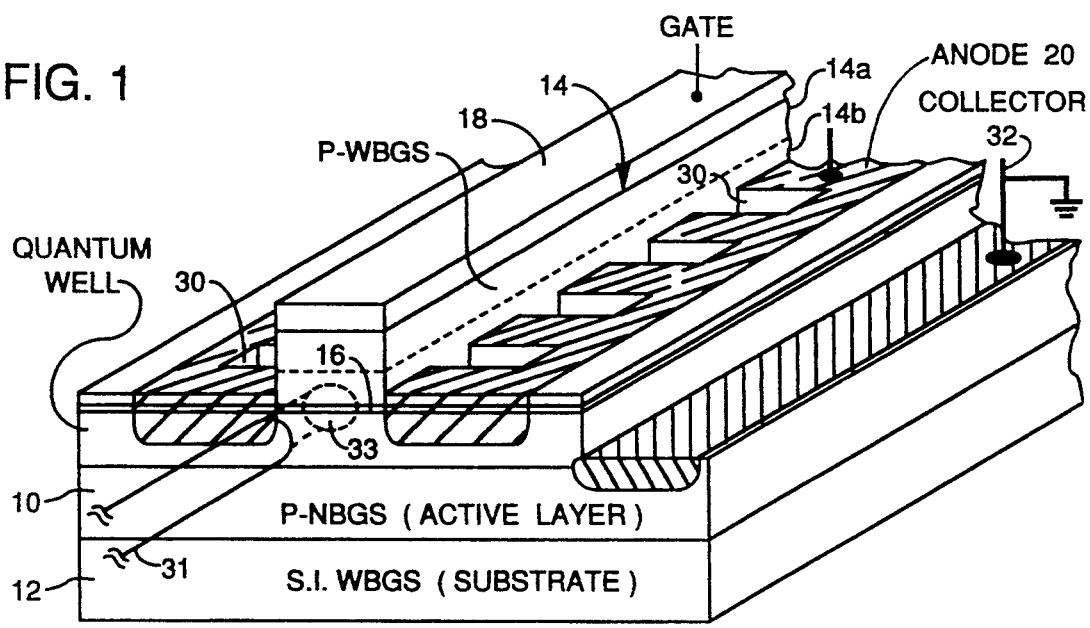
FIG. 1 is a cross section of a isometric view of a preferred embodiment of the invention.
Figure 2:
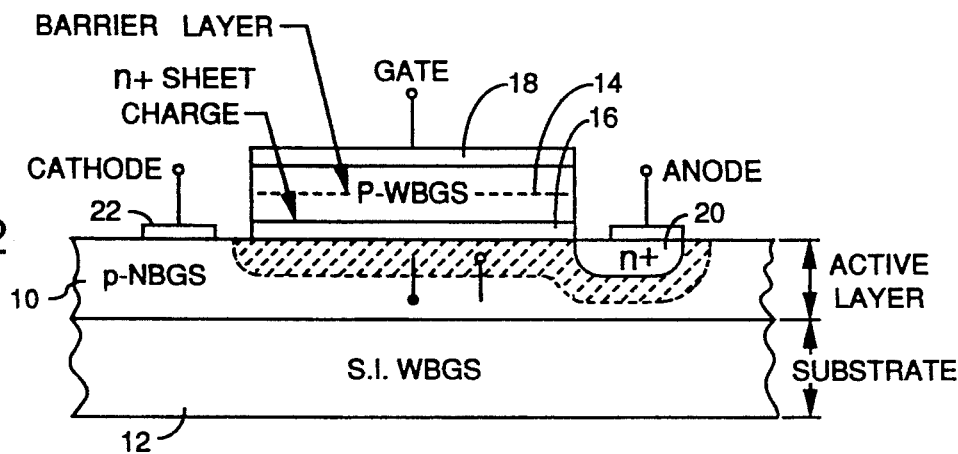
FIG. 2 is a side elevation of the cut-away view of FIG. 1.
Figure 3:
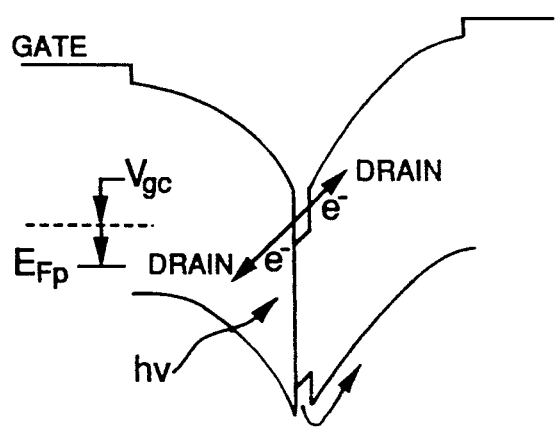
FIG. 3 is an energy band diagram.

Referring to the drawings, the device in accordance with this invention comprises a P-doped graded-band-gap semiconductor (NBGS) 10, which is deposited on an intrinsic wideband-gap semiconductor (WGBS) substrate 12. Substrate 10 is equivalent to the substrate in a conventional N-channel HFET and the "active layer". Subtrate 11 is the quantum well and is the active layer of the HFET since it contains the inversion channel. Thus, the substrate 12 is the undoped material beneath the active layer 10. A wideband-gap semiconductor layer 14 is deposited on top of the active layer 10, and is the gate barrier of the device. The gate barrier 14, comprises of a p+-AlGaAs level 14a and a graded p-AlGaAs level 14b. The gate barrier 14 is initially grown n+ for approximately the first 40A, and this n+ layer 16 is referred to as the "charge sheet". The barrier 14 is then grown p type for the rest of its thickness. A gate electrode 18 is a refractory metal which makes ohmic contact to the barrier layer 14. The anode 20 is an ion implanted n+ well, self aligned with the refractory metal gate 18 in exactly the same manner as the drain in an HFET. In this structure it is ion implanted to form a grating. The cathode 22, which is an alloyed ohmic contact to the active layer 10 (see FIG. 2), is the only deviation from the standard HFET, and therefore, the fabrication methodology is entirely compatible with many of the field effect structures.

The improvement in accordance with this invention is the incorporation of a grating 30 in the ion implanted n+ well of the anode 20. The grating 30 may be produced by an electron beam lithograhic patterning step, followed by a reactive ion etching process which etches a periodic grating in the n+ wells that provide selectivity to a desired optical frequency, as shown in the drawing, the light energy is focused at a spot 33 on the device by means of a fiber optic lens 31. In a practical use, this structure would be within an integrated circuit, and in such a case a waveguide within the circuit would be used to couple light energy to the device, thereby obtaining a low insertion loss. The fiber optic lens would be used to couple into the integrated circuit at the waveguide. A more optimal technique, which is more suited to manufacturing would use the Focused Ion Beam technology in which the ion implantaion is raster scanned in the desired pattern.

Because the device is designed around the HFET and DOES structures, it incorporates a GRINSCH layer structure with a single GaAs quantum well, and hence the optical power from the lens 31 couples into a guiding mode. The absorbing region is the well itself. The principle of operation of the HFED lies in applying a positive bias to the gate 18, and using the depleted GaAs quantum well below the gate to absorb the photons, generating electron-hole pairs. The photocarriers are separated by the high electric field before recombination can occur. The photocurrent is then produced in the external circuit by appropriately biasing the device. For collecting the electrons, a positive bias is applied to both the source and drain contacts, which now act as dual drain contacts. The holes are removed via the collector which is maintained at ground. To maximize the responsivity (i.e., output photocurrent for input optical power) the edge coupling technique for coupling the light from the optical fiber lens 31 is used.

Wavelength selectivity is achieved through the use of the ion implanted grating 30 in the well 20 to obtain a single narrow linewidth emission. This has the added benefit that the grating decreases the required length for complete absorption of the selected wavelength, thereby increasing the speed of the device. The grating is formed by implanting in a periodic fashion the source and drain contacts, i.e., it is periodic in the vertical sidewall of the device absorbing region, defined by the gate length. It uses the principal of electro-refraction to change the refractive index in a periodic manner when a bias voltage is applied to the contact, thereby resulting in wavelength selectivity. The bias voltage alters the electric field under the gate in a periodic fashion. This leads to a periodic variation in refractive index under the gate due to the Quantum Confined Stark Effect (change in absorbtion edge with applied field). There is also a refractive index change in the implanted regions not under the gate. These regions interact with the optical wave producing selectivity.

In essence, as the energy passes through the active region, certain frequencies are reflected back and forth within the grating cavities until absorbed by the device. On the other hand, those frequencies which are not resonant with the grating are not absorbed before passing through the device, and therefore, the device is wavelength selective.

It will be apparent to a person skilled in the art that this invention is subject to various adaptations and modifications. It is intended therefore, that the scope of the invention be limited only by the appended claims as interpreted in the light of the prior art.

What is claimed is:

1. An optical device comprising a heterojunction field effect detector (HFED) having a gate, a grounded collector, and a cathode, said device having wavelength selectivity, said device incorporating a Grinsch layer structure with at least one GaAs quantum well formed as a waveguide;

a source of optical power focused on an end of said quantum well for coupling said power into a guided mode, the absorbing region for said power being the quantum well;

a positive bias applied to the gate, the depleted GaAs quantum well below the gate absorbing the photons and generating electron-hole pairs; and a wavelength selective means comprising an ion implanted grating self aligned and adjacent to said quantum well and optically coupled thereto.

2. The transistor as defined in claim 1 wherein said grating comprises a plurality of rectangular openings in said quantum well, said opening having reflective surfaces therein for reflecting optical energy having a wavelength resonant to the distance between said reflective surface.

* * * * *